(12) United States Patent
Wei et al.

(10) Patent No.: US 9,425,311 B2
(45) Date of Patent: Aug. 23, 2016

(54) MOS TRANSISTORS AND FABRICATION METHODS THEREOF

(71) Applicant: Semiconductor Manufacturing International (Shanghai) Corporation, Shanghai (CN)

(72) Inventors: Qingsong Wei, Shanghai (CN); Shukun Yu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/279,469

(22) Filed: May 16, 2014

(65) Prior Publication Data

US 2014/0346565 A1    Nov. 27, 2014

(30) Foreign Application Priority Data

May 21, 2013   (CN) .......................... 2013 1 0190312

(51) Int. Cl.
| | |
|---|---|
| *H01L 21/338* | (2006.01) |
| *H01L 29/78* | (2006.01) |
| *H01L 29/66* | (2006.01) |
| *H01L 27/092* | (2006.01) |
| *H01L 21/8238* | (2006.01) |
| *H01L 27/02* | (2006.01) |
| *H01L 29/165* | (2006.01) |

(52) U.S. Cl.
CPC ... *H01L 29/7848* (2013.01); *H01L 21/823814* (2013.01); *H01L 27/0207* (2013.01); *H01L 27/092* (2013.01); *H01L 29/165* (2013.01); *H01L 29/66636* (2013.01)

(58) Field of Classification Search
CPC ............. H01L 29/7848; H01L 29/165; H01L 27/0207; H01L 27/092; H01L 21/823814; H01L 29/66636
See application file for complete search history.

(56) References Cited

U.S. PATENT DOCUMENTS

| | | | |
|---|---|---|---|
| 2009/0166676 A1* | 7/2009 | Lee et al. ....................... | 257/192 |
| 2012/0187500 A1* | 7/2012 | Shinkawata ................... | 257/369 |
| 2012/0235208 A1* | 9/2012 | Chen ................... H01L 27/0207 257/191 |

* cited by examiner

*Primary Examiner* — Su C Kim
(74) *Attorney, Agent, or Firm* — Anova Law Group, PLLC (57) ABSTRACT

A method is provided for fabricating MOS transistors. The method includes providing a semiconductor substrate having at least a first region and a second region; and forming first transistors on the semiconductor substrate. Wherein source/drain regions of the first transistors are configured as SiGe growth regions; and a first density of SiGe growth regions in the first region is smaller than a second density of SiGe growth regions in the second region. The method also includes forming dummy SiGe growth regions in the first region to increase the first density such that the total density of SiGe growth regions in the first region is in a range similar to the second density; and forming trenches in the first region and the second region and the dummy SiGe growth region. Further, the method includes forming embedded source/drain regions of the first transistors and dummy SiGe regions.

16 Claims, 6 Drawing Sheets

MOS TRANSISTORS AND FABRICATION METHODS THEREOF

CROSS-REFERENCES TO RELATED APPLICATIONS

This application claims the priority of Chinese patent application No. 201310190312.9, filed on May 21, 2013, the entirety of which is incorporated herein by reference.

FIELD OF THE INVENTION

The present invention generally relates to the field of semiconductor technology and, more particularly, relates to MOS transistors and fabrication techniques thereof.

BACKGROUND

A MOS transistor generates on/off signals by applying a voltage onto the gate to adjust the current of the channel region. In an existing semiconductor manufacturing technology, in order to improve the performance of MOS transistors, the carrier mobility may be increased by introducing a stress into the channel region. For PMOS transistors, an embedded SiGe technology may be used to generate a compressive stress in the channel region to increase the carrier mobility. The embedded SiGe technology may refer to embedding silicon germanium (SiGe) in the regions where source/drain regions are formed. The crystal lattice mismatch between SiGe and the silicon substrate may generate the compressive stress to the channel region.

The existing embedded SiGe technology for forming a CMOS transistor includes sequentially providing a semiconductor substrate; forming a gate structure on the semiconductor substrate; forming sidewall spacers on the side surfaces of the gate structure; forming a barrier layer to cover the NMOS transistor; forming trenches in the regions for forming source/drain regions; and forming source/drain regions by filling the trenches with SiGe. Because the crystal lattice constant of SiGe is greater than Si, a compressive stress may be generated in the channel region of the transistor. Therefore, the carrier (holes) mobility may be improved; and the performance of the PMOS transistor may be improved.

The process for forming SiGe in the trenches may be an epitaxial growth process. The density of PMOS transistors in different regions of a semiconductor substrate may be different; and the area density of the source regions and the drain regions of the transistors may be different at different regions of the semiconductor substrate. That is, the area density of the regions for forming SiGe may be different at different regions of the semiconductor substrate. During the epitaxial growth process, the region with a larger area density may consume more reaction gas; and the region with a smaller area density may consume less reaction gas. Further, the reaction gas transformation rate may dominate the rate of the epitaxial growth. Therefore, it may be easy to cause the height of formed SiGe structures in the region with a lower transistor density to be higher than the height of the formed SiGe structures in the region with a higher transistor density, i.e., overfilled; and the uniformity may be poor.

Figure 1:
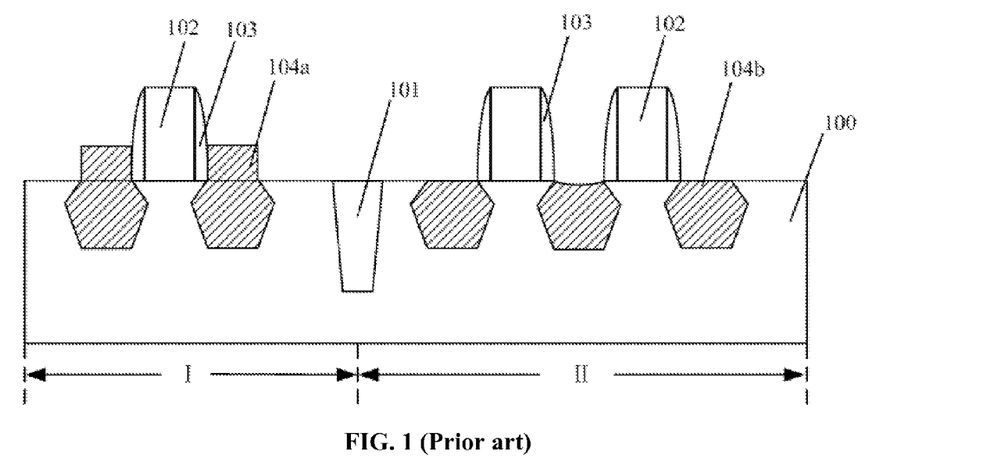
FIG. 1 illustrates existing PMOS transistors having embedded source/drain regions.

FIG. 1 illustrates existing PMOS transistors having embedded source regions and embedded drain regions. As shown in FIG. 1, the PMOS transistors include a semiconductor substrate 100 having a first region I and a second region II isolated by an isolation structure 101. PMOS transistors are formed in the first region I and the second region II. The density of the PMOS transistors in the first region I is smaller than the density of the PMOS transistors in the second region II. That is, the density of the regions for forming SiGe source/drain regions in the first region I is smaller than the density of the regions for forming SiGe source/drain regions in the second region II. The regions for forming SiGe source/drain regions may be referred as SiGe growth regions. The PMOS transistors also includes gate dielectric layers (not shown) formed on the surface of the semiconductor substrate 100, the gates 102 formed on the gate dielectric layers and the offset spacers 103 formed on the side surfaces of the gate dielectric layers and the gates 102. Further, the PMOS transistors include embedded source/drain regions 104a and the embedded source/drain regions 104b. During the process for forming the PMOS transistor, because the density of the SiGe growth regions may be different at different regions of the semiconductor substrate 100, the height of the embedded source/drain regions 104a in the first region may be greater than the height of the embedded source/drain regions 104b in the second region. That is, the trenches for forming the source regions and the drain regions may be overfilled. Some sorts of over fill still exist in embedded source/drain region 104b in the second region II may be still overfilled although it is not shown in FIG. 1, but the over fill in the second region II is significantly lower than in the first region I.

An ion implantation process may be performed onto the embedded source/drain regions 104a and the embedded source/drain regions 104b; because the height of the embedded source/drain regions 104a in the first region I may be greater than the height of the embedded source/drain regions 104b in the second region II, the ion distribution may be un-uniform. Further, when conductive vias are formed in the source/drain regions 104a and the source/drain regions 104b, the depth of the etching holes for forming the conductive vias may be uneven, thus it may cause the conductive vias to have a higher resistance or a leakage current. Thus, the yield of the PMOS transistors may be relatively low; and the performance of the PMOS transistors may be unacceptable.

The disclosed device structures and methods are directed to solve one or more problems set forth above and other problems.

BRIEF SUMMARY OF THE DISCLOSURE

One aspect of the present disclosure includes a method for fabricating PMOS transistors. The method includes providing a semiconductor substrate having at least a first region and a second region; and forming first transistors on the semiconductor substrate in the first region and the second region. Wherein source/drain regions of the first transistors are configured as SiGe growth regions; and a first density of SiGe growth regions in the first region is smaller than a second density of SiGe growth regions in the second region. The method also includes forming dummy SiGe growth regions in the first region to increase the first density such that the total density of SiGe growth regions in the first region is in a range similar to the second density; and forming trenches by etching the SiGe growth regions in the first region and the second region and the dummy SiGe growth region. Further, the method includes forming embedded source/drain regions of the first transistors and dummy SiGe regions by forming SiGe in the trenches.

Another aspect of the present disclosure includes a semiconductor structure containing a plurality of MOS transistors. The semiconductor structure containing a plurality of MOS transistors includes a semiconductor substrate having at least a first region and a second region; and first transistors with embedded source/drain regions formed in the first region and the second region, the embedded source/drain regions of the first transistors being SiGe growth regions, wherein the first transistors in the first region have a first density of the SiGe growth regions and the first transistors in the second region have a second density of the SiGe growth regions. The semiconductor structure containing a plurality of MOS transistors also includes dummy SiGe growth regions formed in the first region to increase the first density such that a total density of the SiGe growth regions in the first region is in a range similar to the second density.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The SiGe source/drain regions 104a and the SiGe source/drain regions 104b illustrated in FIG. 1 may often be formed by a chemical vapor deposition (CVD) process. The deposition rate of the CVD process may depend on the reactant transport velocity and the chemical reaction rate, etc. When the reactant transport velocity is relatively low, the deposition rate may be dominated by the reactant transport velocity. When the reactant transport velocity is high enough, the deposition rate may be dominated by the chemical reaction rate.

The deposition of SiGe may be a selective epitaxial process. SiGe may only be formed on the surface of Si, and may not be formed on the surface of the silicon nitride, or silicon oxide. If the reaction transport velocity is significantly high, the resulted high epitaxial growth rate may reduce the selectivity of SiGe, thus SiGe may be formed on the surface of SiN or SiO. Further, a relatively high epitaxial growth rate may increase the number of defects in the formed SiGe. Thus, in order to obtain SiGe source/drain regions with an acceptable quality, a low reactant transport rate may be used. Correspondingly, the epitaxial growth rate of SiGe may be dominated by the reactant transport rate.

Therefore, referring to FIG. 1, the density of PMOS transistors in the first region I may be smaller than the density of PMOS transistors in the second region II, during an epitaxial growth process for forming SiGe, the consumption of the reaction gas in the first region I may be lower than the consumption of the reaction gas in the second region II, thus the epitaxial growth rate of SiGe in the first region I may be greater than the epitaxial growth rate of SiGe in the second region II. Therefore, the height of the source/drain regions 104a in the first region I may be greater than the height of the source/drain regions 104b in the second region II; and the yield and the performance of the PMOS transistors may be significantly affected. According to the disclosed methods and device structures, the non-uniformity issues and other issues of the embedded source/drain regions may be overcome by forming dummy SiGe growth regions in the regions with a low density of SiGe growth regions.

Figure 10:
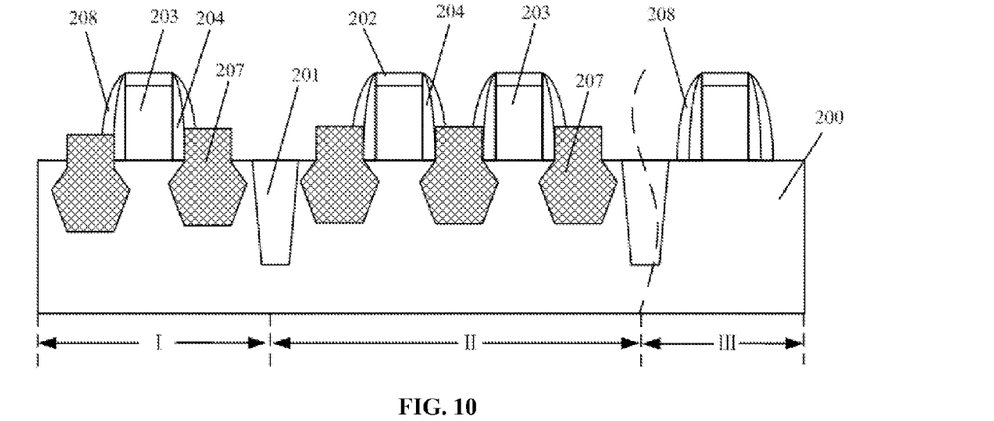
Figure 11:
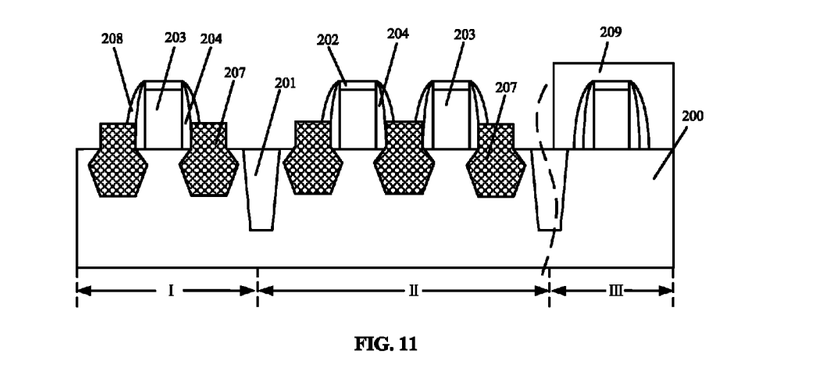
Figure 12:
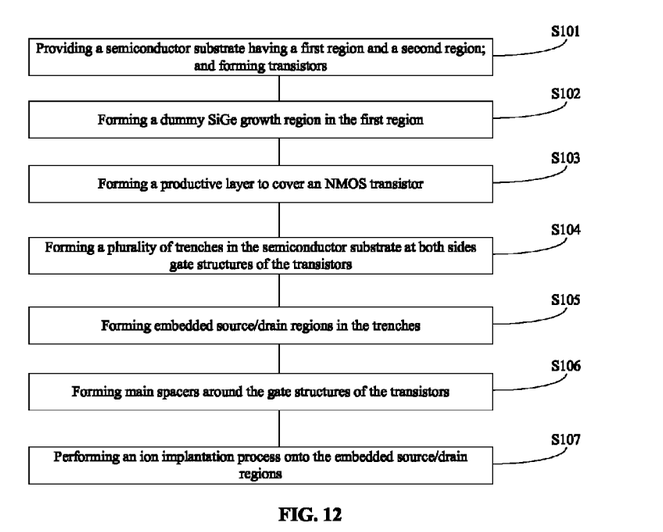
FIG. 12 illustrates an exemplary fabrication process of PMOS transistors consistent with the disclosed embodiments.

FIG. 12 illustrates an exemplary fabrication process of PMOS transistors consistent with disclosed embodiments; and FIGS. 2~11 illustrate semiconductor structures corresponding to certain stages of the exemplary fabrication process.

Figure 2:
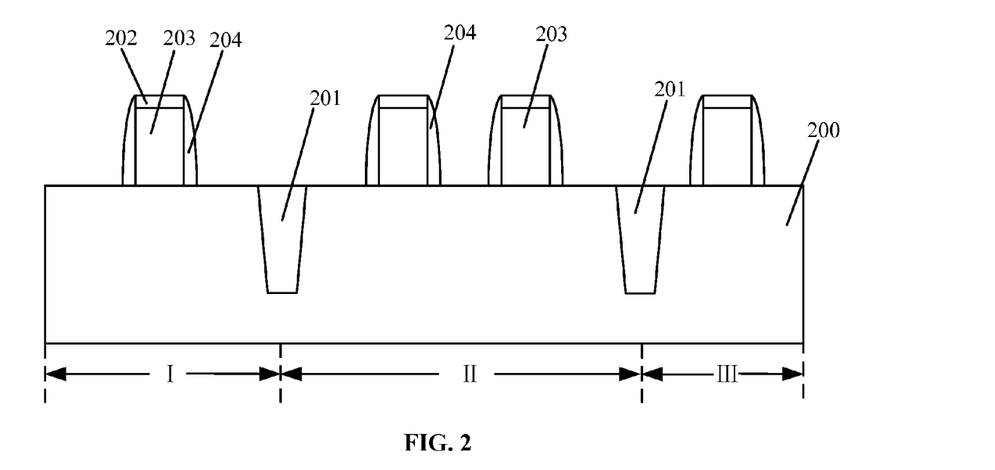
FIGS. 2~11 illustrate semiconductor structures corresponding to certain stages of an exemplary fabrication process of PMOS transistors consistent with the disclosed embodiments.

As shown in FIG. 12, at the beginning of the fabrication process, a semiconductor substrate with certain structures is provided (S101). FIG. 2 illustrates a corresponding semiconductor structure.

As shown in FIG. 2, a semiconductor substrate 200 is provided. The semiconductor substrate 200 may have a first region I, a second region II, and a third region III. PMOS transistors may be formed in the first region I and the second region II. The source/drain regions of the PMOS transistors may be SiGe growth regions. The density of the SiGe growth regions in the first region I may be smaller than the density of the SiGe growth regions in the second region II. The first region I with the smaller density of SiGe growth regions may be referred as an isolated region, and the second region II with the higher density of SiGe growth regions may be referred as a dense SiGe region.

Further, as shown in FIG. 2, the first region I and the second region II may be isolated by an isolation structure 201. In one embodiment, the isolation structure 201 may be a shallow trench isolation structure. The isolation structure 201 may be used to isolate active regions in the semiconductor substrate 200.

Further, as shown in FIG. 2, NMOS transistors may also be formed on the semiconductor substrate 200. For illustrative purposes, in one embodiment, the NMOS transistors may be formed in the third region III in the semiconductor substrate 200. In certain other embodiments, the NMOS transistors may be formed in the first region I and/or the second region II. For example, the NMOS transistors may be formed in the second region II of the semiconductor substrate 200, and the PMOS transistors in the second region II and the NMOS transistors in the second region II may together form memory units of static random access memories. The number of regions and the type of transistors are used for illustrative purposes, any number of regions and/or type of transistors may be included.

The NMOS transistors may be formed in the P-type well regions of the semiconductor substrate 200; and the PMOS transistors may be formed in the N-type well regions of the semiconductor substrate 200. Further, the NMOS transistors and the PMOS transistors may be isolated by the isolation structures 201 formed in the semiconductor substrate 200.

The semiconductor substrate 200 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor, etc. In one embodiment, the semiconductor substrate 200 is made of silicon. The semiconductor substrate 200 provides a base for subsequent processes and structures.

Referring to FIG. 2, each of PMOS transistors may include a gate dielectric layer (not shown) formed on the surface of the semiconductor substrate 200, a gate electrode layer 203 formed on the surface of the gate dielectric layer, a hard mask layer 202 formed on the surface of the gate electrode layer 203, and offset spacers 204 formed on the side surfaces of the gate dielectric layer, the gate electrode layer 203 and the hard mask layer 202.

In one embodiment, when the PMOS transistors are formed, a lightly doped drain (LDD) doping process may be performed onto the semiconductor substrate 200. The LDD doping process may reduce the threshold voltage of the transistors by scattering the relatively strong electric field along the direction from the pinch-off regions of the drain regions to the LDD regions, thus the leakage current may be reduced and the ability for resisting the thermal carriers may be improved.

In one embodiment, the first region I may be configured as a peripheral region of subsequently formed static random access memories (SRAMs); and the second region II may be configured as a storage region of subsequently formed SRAMs. Because the structures of the transistors in the storage region of the SRAMs may be regular; and the transistor density may be relatively large, the transistor density of in the second region II may be greater than the transistor density in the first region I. Further, the source/drain regions of the PMOS transistors may be the SiGe growth regions. Therefore, the density of the SiGe growth regions in the second region II may be greater than the density of the SiGe growth regions in the first region I. In certain other embodiments, the density of the SiGe growth regions in the second region II may be smaller than the density of the SiGe growth regions in the first region I.

Figure 3:
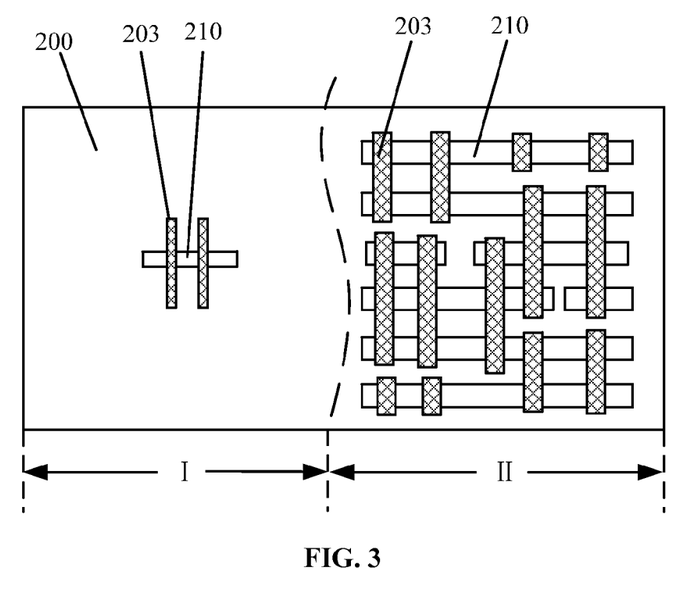

FIG. 3 illustrates a top view of the transistors formed on the semiconductor substrate 200. For illustrative purposes, only the active regions 210 and the gate electrodes 203 are illustrated. The first region I may be configured as a peripheral region of subsequently formed static random access memories (SRAMs); and the second region II may be configured as a storage region of subsequently formed SRAMs. The transistor density in the second region II may be greater than the transistor density in the first region I; and the density of the SiGe growth regions in the second region II may be greater than the density of the SiGe growth regions in the first region I.

As used herein, the density of the SiGe growth regions in the first region I may refer to a percentile of the total area of the source/drain regions of PMOS transistors in the first region I to the total area of the first region I; and the density of the SiGe growth regions in the second region II may refer to a percentile of the total area of the source/drain regions of PMOS transistors in the second region II to the total area of the second region II. In one embodiment, the density of the SiGe growth regions in the second region II may be in a range of approximately 7%~20%; and the density of the SiGe growth regions in the first region I may be in a range of approximately 0%~7%.

Figure 4:
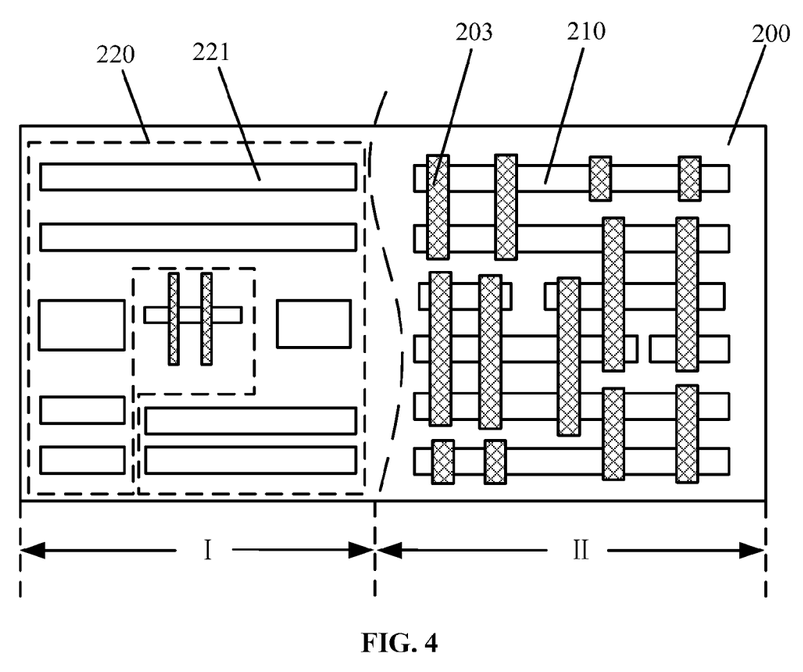

Returning to FIG. 12, after providing the semiconductor substrate 200; and forming the PMOS transistors and the NMOS transistors, a dummy SiGe growth region may be formed (S102). FIG. 4 illustrates a corresponding semiconductor structure.

As shown in FIG. 4, a dummy SiGe growth region 220 is formed in the first region I. The dummy SiGe growth region 220 may be used to increase the total density of the SiGe growth regions. Wherein the total density of SiGe growth regions may refer to the sum density of the SiGe growth regions formed by the source/drain regions of the PMOS transistors in the first region I and the dummy SiGe growth region 220 in the first region I.

Referring to FIG. 4, in one embodiment, the dummy SiGe growth region 220 may consists of a plurality of dummy active regions 221. The dummy active regions 221 may be formed during forming the PMOS transistors in the first region I and the second region II. When the PMOS transistors in the first region I and the second regions II are being formed, a mask for forming the dummy active regions 221 may be added into the layout. Thus, the dummy SiGe growth region 220 may be formed by subsequently forming SiGe in the dummy active region 221 using appropriate masks. The process complexity and the production cost may be reduced by using the dummy active regions 221 as the dummy SiGe growth region 220. Further, when the dummy active regions 221 are used for the dummy SiGe growth regions, the range for adjusting the total density of SiGe growth regions may be broadened.

Figure 5:
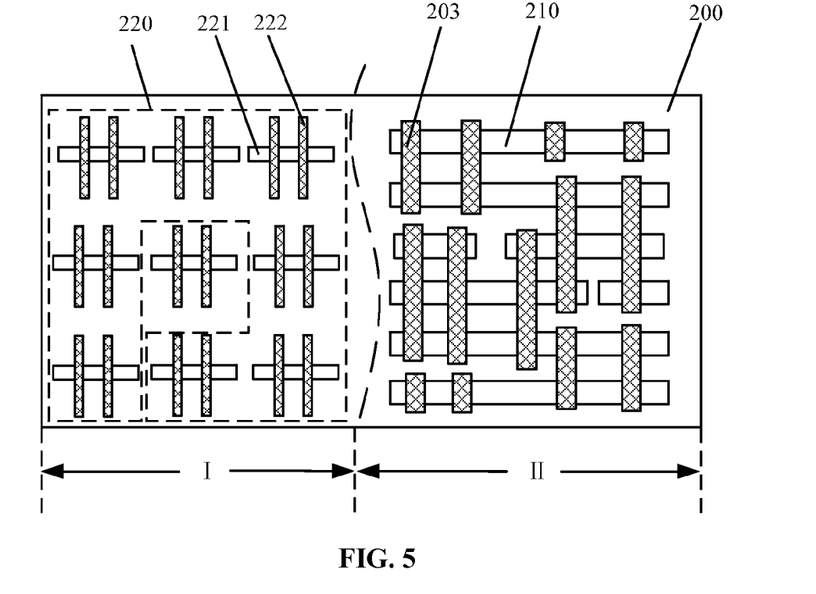
Figure 6:
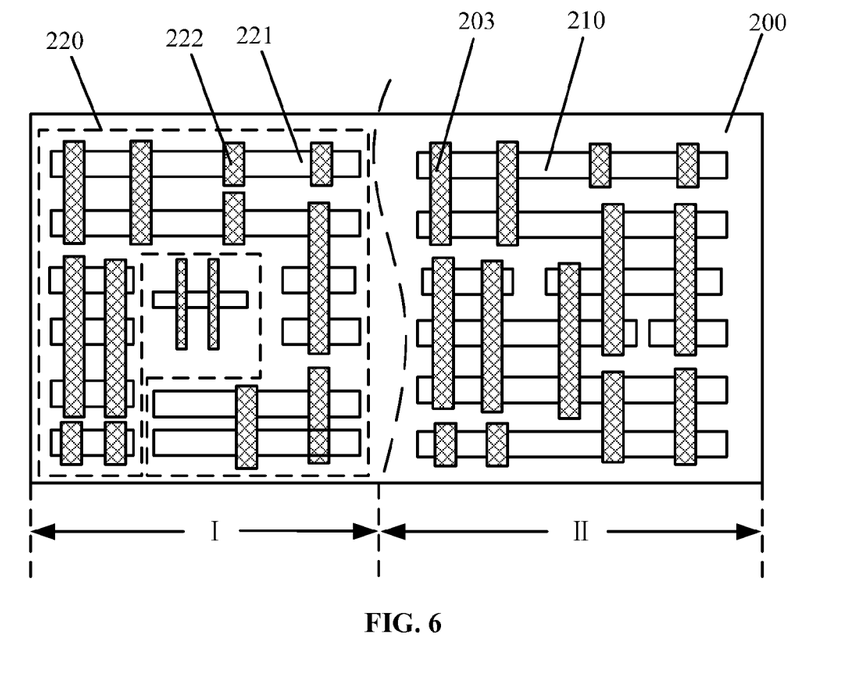

In certain other embodiments, the dummy SiGe growth region 220 may also be dummy source/drain regions of the dummy PMOS transistors. In one embodiment, as shown in FIG. 5, the dummy SiGe growth region 220 may consist of dummy source/drain regions of dummy PMOS transistors. The structure of the dummy transistors may be same as the structure of the PMOS transistors in the first region I. In another embodiment, as shown in FIG. 6, the dummy SiGe growth region 220 consists of dummy source/drain regions of the dummy PMOS transistors. The dummy PMOS transistors may be same as the PMOS transistors in the second region II. For illustrative purposes, only the dummy source region 221 and the dummy drain gate 222 are illustrated in FIG. 5 and FIG. 6.

When the dummy SiGe growth region 220 consists of the source/drain regions of the dummy PMOS transistors, and the dummy PMOS transistors are same as the PMOS transistors in the first region I and the second region II, the dummy transistors may be formed by adding a mask onto the layout for forming the PMOS transistors in the first region I and the second region II. A process for forming the dummy transistors may include sequentially forming dummy active regions 221; forming dummy gate dielectric layers (not shown) on the dummy active regions 221; forming dummy gates 222 on the dummy gate dielectric layers and forming dummy source/drain regions and/or other structures in the dummy active regions 221 at both sides of the dummy gates 222.

A mask may be added in the subsequent SiGe deposition process, thus the dummy SiGe growth region 220 may be formed by depositing SiGe in the dummy source/drain regions of the dummy PMOS transistors. When the dummy source/drain regions of the dummy PMOS transistors are used as the dummy SiGe growth region 220, because the fabrication environment of the dummy SiGe growth region 220 is more similar as the normal PMOS transistors, the stress environment of the PMOS transistors in the first region I may not be negatively affected; and the formation of the PMOS transistors in the first region I may not be affected.

In one embodiment, the dummy SiGe growth region 220 may be formed during forming the PMOS transistors in the first region I and the second region II. Specifically, a layout for forming the dummy SiGe growth region 220 may be added onto the layout for forming the PMOS transistors in the first region I and the second region II, thus the PMOS transistors in the first region I and the second region II and the dummy SiGe growth region 220 may be formed simultaneously.

The dummy SiGe growth region 220 may be dummy source regions. The dummy SiGe growth region 220 may also be dummy source regions or dummy drain regions of the dummy PMOS transistors. The structure of the dummy PMOS transistors may be similar as the structure of the PMOS transistors in the first region I, or the structure of the transistors in the second region II. The dummy SiGe growth region 220 may also be a mixture SiGe growth regions of the dummy drain regions, the dummy source regions and drain regions of the dummy PMOS transistors having a same structure as the PMOS transistors in the first region I and the dummy source regions and drain regions of the dummy transistors having a same structure as the PMOS transistors in the second region II.

After forming the dummy SiGe growth region 220, the total density of the SiGe growth regions in the first region I may be increased. For example, the total density of the SiGe growth regions in the first region I may increase to approximately 0.5~1.1 times of the total density of the SiGe growth regions in the second region II.

In one embodiment, the total density of the SiGe growth regions in the first region I may be equal to the total density of the SiGe growth regions in the second region II. Trenches may be subsequently formed by etching the SiGe growth regions in the first region I and the second region II and the dummy SiGe region 220 in the first region I; and SiGe may be deposited in the trenches. Because the total density of the SiGe growth regions in the first region I may be equal to the total density of the SiGe growth regions in the second region II, the consumption of the reaction gas for forming SiGe may be same in the first region I and the second region II; and the deposition rate in the first region I and the second region II may be same as well. Therefore, the height of embedded source/drain regions formed in the first region I and the second region II may be same; and the uniformity of the embedded source/drain regions may match the desired requirements.

Figure 7:
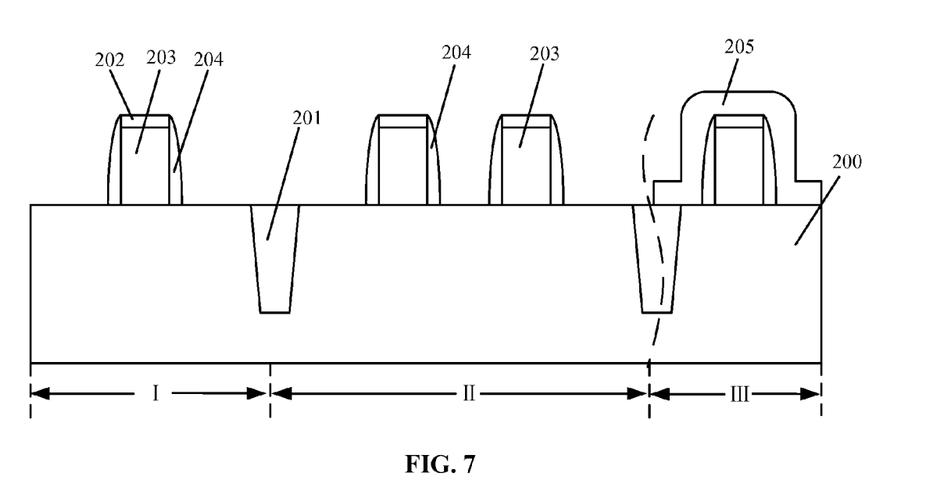

Returning to FIG. 12, after forming the dummy SiGe growth region 220, a protective layer may be formed (S103). FIG. 7 illustrates a corresponding semiconductor structure.

As shown in FIG. 7, a protective layer 205 is formed to cover the NMOS transistor on the semiconductor substrate 200 in the third region III. Further, the SiGe growth regions in the first region I and the second region II and the dummy SiGe region 220 in the first region I may be exposed.

Specifically, a process for forming the protective layer 205 may include sequentially forming a protective material layer to cover the PMOS transistors in the first region I and the second region II, the NMOS transistor in the third region III and the dummy SiGe growth region 220; forming a photoresist layer on the protective material layer; etching the protective material layer until the semiconductor substrate 200 is exposed; and the removing the photoresist layer. Thus, the proactive layer 205 may be formed on the NMOS transistor to protect the NMOS transistor. Further, temporary offset spacers (not shown) may be formed on the offside spacers 204 on the PMOS transistors and the dummy PMOS transistors.

The protective layer 205 may be made of any appropriate material, such as silicon oxide, silicon nitride, or silicon oxynitride, etc. In one embodiment, the protective layer 205 is made of silicon nitride. In certain other embodiments, the protective layer 205 may also be a multiple-stacked layer made of both silicon oxide and silicon nitride.

Various processes may be used to etch the protective material layer, such as a dry etching process, a wet etching process, or an ion beam etching process. In one embodiment, the protective material layer is etched by a reactive ion etching (RIE) process. Any appropriate gas may be used for the reactive ion etching (RIE) process. In one embodiment, the etching gas may include $CF_4$, $O_2$ and He, etc. Because the RIE process may have a good anisotropic etching selectivity, after the RIE process, the silicon nitride layer protected by the photoresist layer may be left to form the protective layer 205; the silicon nitride layer formed on the offset spacers 204 may be left; and other portions of the protective material layer may be removed.

The protective layer 205 may be used to protect the source/drain regions of the NMOS transistor from being damaged during subsequently etching the SiGe growth regions in the first region I and the second region II and the dummy SiGe region 220 in the first region I. Further, subsequently formed SiGe may not grow on the protective layer 205 during a selective epitaxial growth process.

Figure 8:
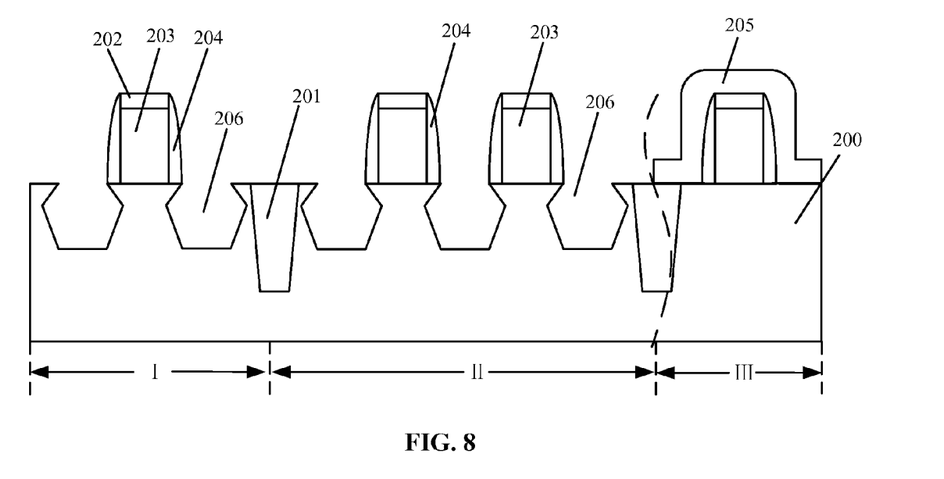

Returning to FIG. 12, after forming the protective layer 205, a plurality of trenches may be formed in the semiconductor substrate 200 (S104). FIG. 8 illustrates a corresponding semiconductor structure.

As shown in FIG. 8, a plurality of trenches 206 are formed in semiconductor substrate 200 in the first region I and the second region II. The trenches 206 may be formed in the semiconductor substrate 200 at both sides of the offset spacers 204.

The trenches 206 may be formed by etching the SiGe growth regions in the first region I and the second region II and the dummy SiGe growth region 220 in the first region I using the gates of the PMOS transistors, the dummy transistors and the temporary offset spacers as an etching mask. The trenches 206 may be any appropriate shapes, such as a rectangular shape, or a sigma shape, etc. In one embodiment, the trenches 206 have a sigma shape. The middle of the sigma shape trenches 206 may have an apex directing to the channel region of the transistors. SiGe may be subsequently formed in the trenches 206 and SiGe may fill up the trenches 206, thus SiGe at the apex may more close to the channel region of the PMOS transistors; and the stress introduced into the channel regions may be increased, which may increase the carrier mobility of the channel region.

In one embodiment, a process for forming the sigma shape trenches 206 may include performing a plasma dry etching process; and followed by a wet etching process. Rectangular shape pre-trenches (not shown) may be formed by the plasma dry etching process. The rectangular shape pre-trenches may be further etched to form the sigma shape trenches 206 by the wet etching process.

The etching gas for the plasma etching process may include HBr, $O_2$, He, $Cl_2$ and $NF_3$, etc. The flow of HBr may be in a range of approximately 100 sccm~1000 sccm. The flow of $O_2$ may be in a range of approximately 2 sccm~200 sccm. The flow of He may be in a range of approximately 100 sccm~1000 sccm. The flow of $Cl_2$ may be in a range of approximately 2 sccm~200 sccm. The flow of $NF_3$ may be in a range of approximately 2 sccm~200 sccm. The etching pressure may be in a range of approximately 10 mTorr~200 mTorr. The bias voltage may be in a range of approximately 0~400V. The etching time may be in a range of approximately 5 s~500 s.

Various chemicals may be used for the wet etching process. In one embodiment, a tetramethylammonium hydroxide (TMAH) solution is used for the wet etching process. The temperature of the TMAH solution may be in a range of 15° C.~17° C. The etching time of the wet etching process may be in a range of approximately 20 s~500 s. In certain other embodiments, a KOH solution or an ammonia solution may be used for the wet etching process.

Figure 9:
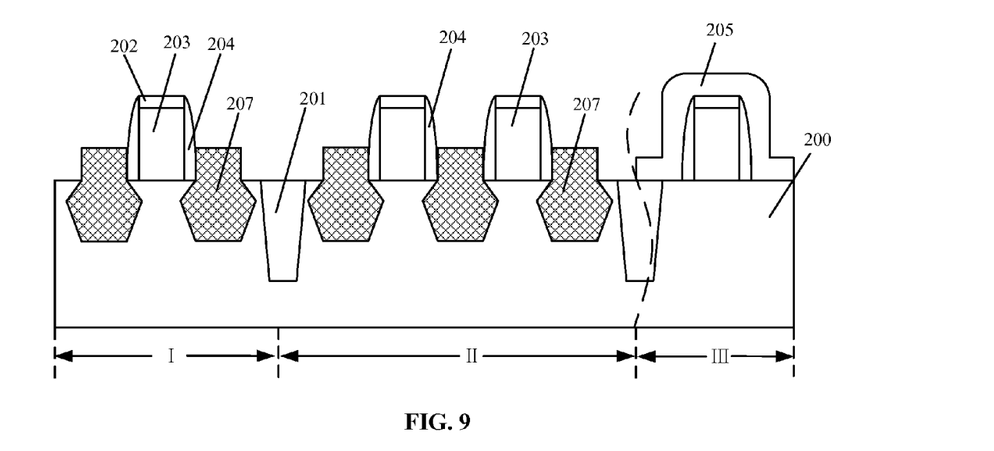

Returning to FIG. 12, after forming the trenches 206, embedded source/drain regions may be formed (S105). FIG. 9 illustrates a corresponding semiconductor structure.

As shown in FIG. 9, embedded source/drain regions 207 are formed in the trenches 206. Further, dummy SiGe regions (not shown) may also be formed in the trenches formed in the dummy SiGe growth region 220. The top surface of the embedded source/drain regions 207 may be higher than the top surface of the semiconductor substrate 200.

The embedded source/drain regions 207 may be formed by depositing SiGe into the trenches 206. Various processes may be used to deposit SiGe into the trenches 206, such as a CVD process, a molecular beam epitaxial growth (MBE) process, an atomic layer deposition process, or a flowable CVD process, etc. In one embodiment, the embedded source/drain regions 207 are formed by a selective epitaxial growth process, such as an ultrahigh vacuum CVD (UHVCVD) process, or a MBE process. The absorption of the epitaxial material onto the surface of silicon or poly silicon may be greater than the absorption of the epitaxial material onto the surface of the oxides or nitrides, thus the selectivity of the epitaxial growth process may be achieved.

In one embodiment, the semiconductor substrate 200 may be silicon; the side surfaces and the bottoms surfaces of the trenches 206 may also be silicon; thus the embedded source/drain regions 207 and the dummy SiGe regions may be formed by depositing SiGe into the trenches 206 by an UHVCVD process. The silicon source gas may be $SH_4$ or $SiH_2Cl_2$, etc. The flow of the silicon source gas may be in a range of approximately 1 sccm~1000 sccm. The germanium source gas may be $GeH_4$, etc. The flow of the germanium source gas may be in a range of approximately 1 sccm~1000 sccm. The reaction temperature may be in a range of approximately 500° C.~800° C. The reaction pressure may be in a range of approximately 1 Torr~100 Torr.

Referring to FIG. 9, the surface of the NMOS transistor may be covered by the protective layer 205; and the top surfaces and the side surfaces of the PMOS transistors may be covered by the hard mask layer 202 and the temporary offset spacers, respectively. Further, the protective layer 205, the hard mask layer 202 and the temporary offset spacers may be made of silicon nitride. Thus, SiGe may not be formed on the surface of the NMOS transistor and the top surfaces and the side surfaces of the PMOS transistors and the dummy PMOS transistors; and may be only formed in the trenches 206. SiGe formed at the original positions of the source/drain regions of the PMOS transistors may form the embedded source/drain regions 207 of the PMOS transistors; and SiGe formed at the original position of the source/drain regions of the dummy PMOS transistors may form the dummy SiGe regions.

The dummy SiGe growth region 220 may be formed in the first region I; and the total density of the SiGe growth regions may be increased to cause the total density of the SiGe growth regions in the first region I to be equal to, or similar as the total density of the SiGe growth regions in second region II, thus when SiGe is formed in the trenches 206 by a selective epitaxial growth process, the reaction gas consumption in the first region I and the reaction gas consumption in the second region II may be same during the epitaxial growth process. Further, the gas density of the first region I and the gas density of the second region II may be same; and the growth rate of the epitaxial film may be dominated by the reactant transport velocity during a normal SiGe epitaxial growth process, thus the growth rate of SiGe in the first region I and the growth rate of SiGe in the second region II may be same. Therefore, the height of the embedded source/drain regions 207 may be uniform; and the uniformity of the source/drain regions 207 may match the desired requirements.

Returning to FIG. 12, after forming the embedded source/drain regions 207, main spacers may be formed (S106). FIG. 10 illustrates a corresponding semiconductor structure.

As shown in FIG. 10, main spacers 208 are formed on the side surfaces of the offset sidewall spacers 204. Specifically, a process for forming the main spacers 208 may include sequentially removing the protective layer 205; forming a main sidewall spacer material layer to cover the PMOS transistors and NMOS transistors; performing an etch back process onto the main spacer material layer until the surface of the semiconductor substrate 200 is exposed. Thus, the main spacers 208 may be formed on the side surfaces of the offset sidewall spacers 204 of the PMOS transistors and the NMOS transistors.

Various processes may be used to remove the protective layer 205, such as a dry etching process, or a wet etching process, etc. The protective layer 205 may also be removed by a plasma ashing process if the protective layer is made of organic material, such as photoresist, etc.

The main spacers 208 may be made of any appropriate material, such as silicon oxide, silicon nitride, silicon oxynitride, or low dielectric constant material, etc. The main spacers 208 may also be a multiple-stacked layer made of two or more types of material.

Various processes may be used to form the main spacer material layer, such as a CVD process, a PVD process, an FCVD process, or an atomic layer deposition (ALD) process, etc. In one embodiment, the main spacer material layer is formed by a CVD process, or an ALD process.

Various processes may be used to etch the main spacer material layer, such as a dry etching process, a wet etching process, or an ion beam etching process, etc. In one embodiment, a dry etching process is used to etch the main spacer material layer to form the mains spacers 208.

Returning to FIG. 12, after forming the main spacers 208, a photoresist layer may be formed to cover the NMOS transistor; and an ion implantation process may be performed onto the embedded source/drain regions 207 (S107). FIG. 11 illustrates a corresponding semiconductor structure.

As shown in FIG. 11, a photoresist layer 209 is formed to cover the NMOS transistor. The photoresist layer 209 may be used to protect the source region and the drain region of the NMOS transistor from being damaged by a subsequent ion implantation process. The photoresis layer 209 may be formed by a photolithography process, or other appropriate processes.

Further, after forming the photoresist layer 209, an ion implantation process may be performed. The ion implantation process may be used to dope the source/drain regions 207 of the PMOS transistors.

The source/drain regions 207 of PMOS transistors may be doped with any appropriate type of ions. In one embodiment, the source/drain regions 207 of the PMOS transistors may be doped with P-type ions. The P-type ions may include one or more of boron ions, indium ions and gallium ions, etc. Because the total density of the SiGe growth regions in the first region I and the total density of the SiGe growth regions in the second region II may be equal or similar, the heights of the embedded source/drain regions 207 may be same. With a same doping energy and a same doping dose, the doping profiles of the embedded source/drain regions 207 in the first region I and the second region II may be uniform after the ion implantation process.

After performing the ion implantation process, the photoresist layer 209 may be removed; and a photoresist layer (not shown) may be formed to cover the PMOS transistors. Then, an N-type ion implantation process may be performed onto the source region and the drain region of the NMOS transistor. Further, a dielectric layer (not shown) may be formed to cover the PMOS transistors and the NMOS transistor; and followed by a planarization process. Further, through holes (not shown) exposing the source regions and/or the drain regions of the transistors may be formed in the dielectric layer; and conductive vias may be formed in the through holes. Because the height of the source/drain regions 207 may be same; the depth of the through holes formed by etching through the dielectric layer may be same; and the morphology of the conductive vias may be same. Therefore, the yield and the performance of the PMOS transistors may match the desired requirements.

Thus, MOS transistors may be formed by the above disclosed processes and methods; and corresponding MOS transistors are illustrated in FIG. 11. The MOS transistors include a semiconductor substrate 200 having a first region I, a second region II and a third region III. The MOS transistors also include isolated PMOS transistors formed with dummy transistors (not shown) on the semiconductor substrate 200 in the first region I, a plurality of PMOS transistors formed in the second region II and NMOS transistors formed in the third region III. Wherein each of the PMOS transistors may have a gate electrode 207 formed on the semiconductor substrate 200; a hard mask layer 202 formed on the gate electrode 207, offset spacers 204 formed on the side surfaces of the gate electrode 207 and the hard mask layer 202; and main spacers 208. Further, each of the PMOS transistors may have embedded source/drain regions 207 formed in the semiconductor substrate 200 at both sides of the gate electrode 203. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating MOS transistors, comprising:
providing a semiconductor substrate having at least a first region and a second region;
forming PMOS transistors on the semiconductor substrate in the first region and the second region, wherein source/drain regions of the PMOS transistors are configured as SiGe growth regions; and a first density of the SiGe growth regions in the first region is smaller than a second density of the SiGe growth regions in the second region;
after forming the PMOS transistors in the first region and the second region, separately forming dummy SiGe growth regions of dummy PMOS transistors in the first region to increase the first density, such that a total density of the SiGe growth regions from both the PMOS transistors and the dummy PMOS transistors in the first region equals to the second density of the SiGe growth regions from the PMOS transistors in the second region;
forming trenches by etching the SiGe growth regions in the first region and the second region and the dummy SiGe growth regions in the first region; and
forming embedded source/drain regions of the PMOS transistors and dummy SiGe regions by forming SiGe in the trenches.

2. The method according to claim 1, wherein forming the dummy SiGe regions further includes:
forming dummy active regions.

3. The method according to claim 2, after forming the dummy active regions, further including:
forming gate structures on the dummy active regions; and
forming source regions and drain regions in the dummy active regions at both sides of the gate structures to form the dummy PMOS transistors.

4. The method according to claim 3, wherein:
the dummy SiGe growth regions are dummy source/drain regions of the dummy PMOS transistors.

5. The method according to claim 3, wherein:
a structure of the dummy PMOS transistors is same as a structure of the PMOS transistors in the first region; or
a structure of the dummy PMOS transistors is same as a structure of the PMOS transistors in the second region.

6. The method according to claim 1, further including:
forming NMOS transistors in a third region of the semiconductor substrate.

7. The method according to claim 6, before forming trenches, further including:
forming a protective layer to cover the NMOS transistors and expose the SiGe growth regions in the first region and the second region and the dummy SiGe growth region in the first region.

8. The method according to claim 7, after forming the embedded source/drain regions and the dummy SiGe regions, further including:
forming main spacers around the PMOS transistors and the NMOS transistors; and
performing an ion implantation process onto the embedded source/drain regions.

9. The method according to claim 1, wherein:
SiGe is formed in the trenches by a selective epitaxial growth process.

10. A semiconductor structure containing a plurality of MOS transistors, comprising:
a semiconductor substrate having at least a first region and a second region;
PMOS transistors with embedded source/drain regions formed in the first region and the second region, the embedded source/drain regions of the PMOS transistors being SiGe growth regions, wherein the PMOS transistors in the first region have a first density of the SiGe growth regions and the PMOS transistors in the second region have a second density of the SiGe growth regions; and
dummy SiGe growth regions of dummy PMOS transistors separately formed in the first region, in addition to the PMOS transistors formed in the first and second regions, to increase the first density such that a total density of the SiGe growth regions from both the PMOS transistors and the dummy PMOS transistors in the first region equals to the second density of the SiGe growth regions from the PMOS transistors in the second region.

11. The semiconductor structure containing a plurality of MOS transistors according to claim 10, wherein:
the first region is a peripheral region of a static random access memory.

12. The MOS transistors according to claim 10, wherein:
the second region is a storage region of a static random access memory.

13. The semiconductor structure containing a plurality of MOS transistors according to claim 10, wherein:
a total density of the SiGe growth regions from the PMOS transistors in the first region is in a range of approximately 0~7%; and
a total density of the SiGe growth regions from the PMOS transistors in the second region is in a range of approximately 7%~20%.

14. The semiconductor structure containing a plurality of MOS transistors according to claim 10, wherein:
NMOS transistors are formed in a third region of the semiconductor substrate.

15. The semiconductor structure containing a plurality of MOS transistors according to claim 10, wherein:
the dummy SiGe growth regions are dummy source regions and drain regions of the dummy PMOS transistors.

16. The semiconductor structure containing a plurality of MOS transistors according to claim 10, wherein:
the dummy SiGe growth regions are a mixture region of dummy active regions and the dummy source regions and drain regions of the dummy PMOS transistors.

* * * * *